(12) United States Patent
Nirschl

(10) Patent No.: US 7,570,507 B2
(45) Date of Patent: Aug. 4, 2009

(54) QUASI-DIFFERENTIAL READ OPERATION

(75) Inventor: Thomas Nirschl, Essex Junction, VT (US)

(73) Assignee: Infineon Technologies North America Corp., Milpitas, CA (US)

( * ) Notice: Subject to any disclaimer, the term of this patent is extended or adjusted under 35 U.S.C. 154(b) by 0 days.

(21) Appl. No.: 11/771,312

(22) Filed: Jun. 29, 2007

(65) Prior Publication Data

US 2009/0003033 A1    Jan. 1, 2009

(51) Int. Cl.
*G11C 11/00* (2006.01)
(52) U.S. Cl. ............. 365/148; 365/203; 365/189.011; 365/189.04; 365/207
(58) Field of Classification Search ........... 365/148, 365/203, 189.011, 189.04, 207, 196
See application file for complete search history.

(56) References Cited

U.S. PATENT DOCUMENTS

| 6,985,389 B2 * | 1/2006 | Ma .................. 365/189.07 |
| 2004/0225829 A1 * | 11/2004 | Akiyama et al. ......... 711/104 |
| 2006/0146634 A1 * | 7/2006 | Osada et al. ............ 365/226 |
| 2007/0147102 A1 * | 6/2007 | Roehr ................... 365/100 |

* cited by examiner

*Primary Examiner*—Thong Q Le
(74) *Attorney, Agent, or Firm*—Eschweiler & Associates, LLC

(57) ABSTRACT

A memory device includes an array portion of resistive memory cells comprising a plurality of bit line pairs. The device further includes a read circuit operably associated with a first charged line, wherein the read circuit comprises a precharge circuit configured to charge a first line at a first rate, and to charge a second line at a second rate, the first and second charge rates based on a state of a memory cell coupled between the respective lines. The read circuit may further include a ground circuit configured to pull the respective lines to a ground potential, and a sense circuit coupled to the line pair configured to sense a differential voltage between the line pair in response to the state of the memory cell.

24 Claims, 4 Drawing Sheets

QUASI-DIFFERENTIAL READ OPERATION

FIELD OF INVENTION

The present invention relates generally to semiconductors and more particularly to improved methods and devices for semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

One type of non-volatile memory that has recently been developed is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds to a logic "1", and the less conductive state corresponds to a logic "0" (or vice versa). Suitable resistive memories can be, for example, perovskite memory, as described in W. W. Zhuang et al., "Novel Colossal Magnetoresistive Thin Film Nonvolatile Resistance Random Access Memory (RRAM)", IEDM 2002, resistive switching in binary oxides (OxRAM), for example, as described in I. G. Baek et. al., "Multi-layer crosspoint binary oxide resistive memory (OxRAM) for post-NAND storage application", IEDM 2005, phase change memory (PCRAM), and conductive bridging RAM (CBRAM).

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current is applied to the electrodes, wherein the current heats the phase change material beyond the crystallization temperature thereof. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell. Reading these SET and RESET data states is sometimes called a read operation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a memory device comprising an array portion of memory cells. A read circuit is provided and is associated with respective pairs of bit lines in the array portion and is configured to read from a memory cell associated with the respective bit line pair. A method of addressing a memory is also disclosed and comprises using read circuitry associated with a bit line pair to read a state of a memory cell associated with the bit line pair.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
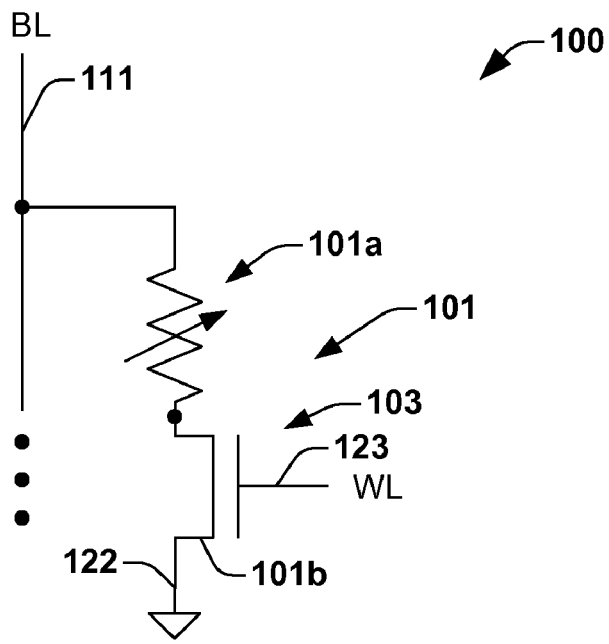
FIGS. 1A and 1B are schematic diagrams illustrating a single ended configuration and a differential configuration of a resistive memory cell, respectively, according to an embodiment of the invention.

One or more implementations of the present invention will now be described with reference to the attached drawings, wherein like reference numerals are used to refer to like elements throughout. The invention relates to a quasi-differential read memory circuit architecture and associated method of reading the state of a resistive memory cell in such an architecture.

In resistive memories, the programmable material may tend to transition from the more resistive state to the less resistive state (or vice versa) over time, depending on which state is more energetically favorable. Due to this drift, data within individual cells may be lost or corrupted, causing data failures. Over time and/or continued stress, a breakdown of the resistive materials, for example, may take place within a phase change memory element. Therefore, methods and devices are needed to reduce this drift, data failures, and avoid such material breakdowns. In addition, methods and systems are needed to optimize other memory features, such as more accurate read operations of resistive memories.

Figure 1B:
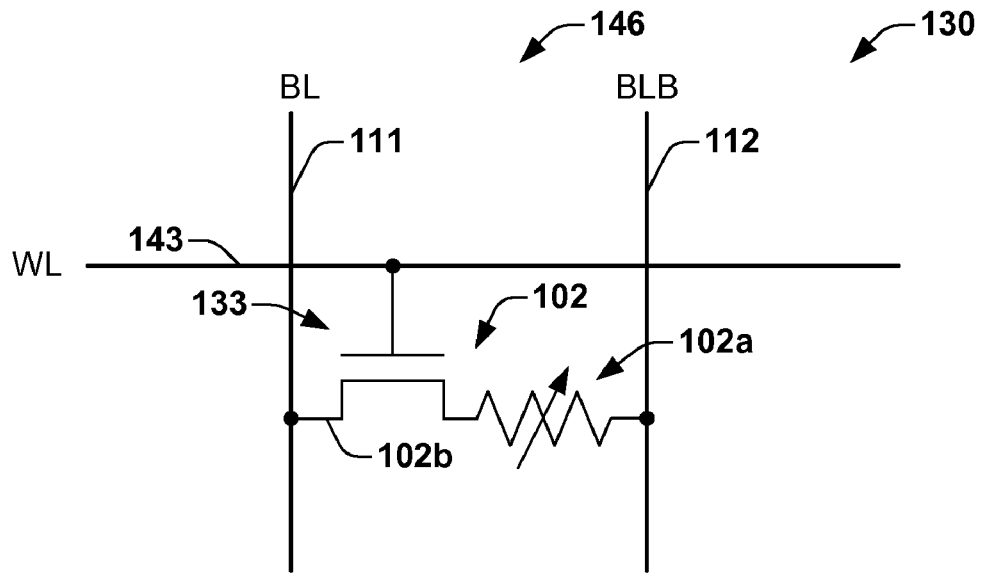

Turning to FIGS. 1A and 1B, schematic diagrams of a single ended configuration 100 and a differential configuration 130 of a resistive memory cell, such as a phase change memory cell (PCRAM), respectively, are illustrated, according to one embodiment of the invention.

FIG. 1A, for example, illustrates a single-ended PCRAM configuration 100 resistive memory cell, such as a PCRAM cell 101. The PCRAM memory cell 101 comprises a memory element (ME) 101a and a word line select circuit 103 such as a word line select transistor 101b. PCRAM memory cell 101 is coupled between a bit line (BL) 111 and a predetermined potential such as ground (Gnd) 122 at a ground potential. When WL select transistor 101b is selected by a word line (WL) 123, the memory element ME 101a is coupled between the bit line BL 111 and ground GND 122 at a ground potential, thereby providing access to the memory cell 101 for various read or write operations.

Similarly, FIG. 1B, for example, illustrates a differential PCRAM configuration 130 resistive memory cell, such as a PCRAM cell 102. The PCRAM memory cell 102 comprises a memory element (ME) 102a and a word line select circuit 133 such as a word line select transistor 102b. PCRAM memory cell 102 is coupled between a bit line (BL) 111 and a bit line bar (BLB) 112 comprising a bit line pair 146. When WL select transistor 102b is selected by a word line (WL) 143, the memory element ME 102a is coupled between the bit line BL 111 and the bit line bar (BLB) 112, thereby providing access to the memory cell 102 for various read or write operations between BL 111 and BLB 112. For example, a SET and a RESET data state of the PCRAM cell 102 may be read or sensed between the bit line pair 146.

Although the reading of a SET and RESET state or data state of the resistive or PCRAM memory cell is discussed and/or illustrated throughout, the inventor of the present invention has also appreciated that another intermediate state or data level between the SET and RESET states such as in a multi-level memory architecture may be utilized in the context of the embodiments of the present invention.

In one embodiment of a phase change memory, a phase change element can be programmed to a SET state or a RESET state. Typically, a SET state is established with a lower magnitude current pulse for a longer duration of time than that used for a RESET pulse. The SET pulse acts to more slowly heat the phase change material to achieve a relatively crystalline state, while the RESET pulse acts to quickly heat/ melt the material and then quickly quench the material to form an amorphous state.

Figure 2:
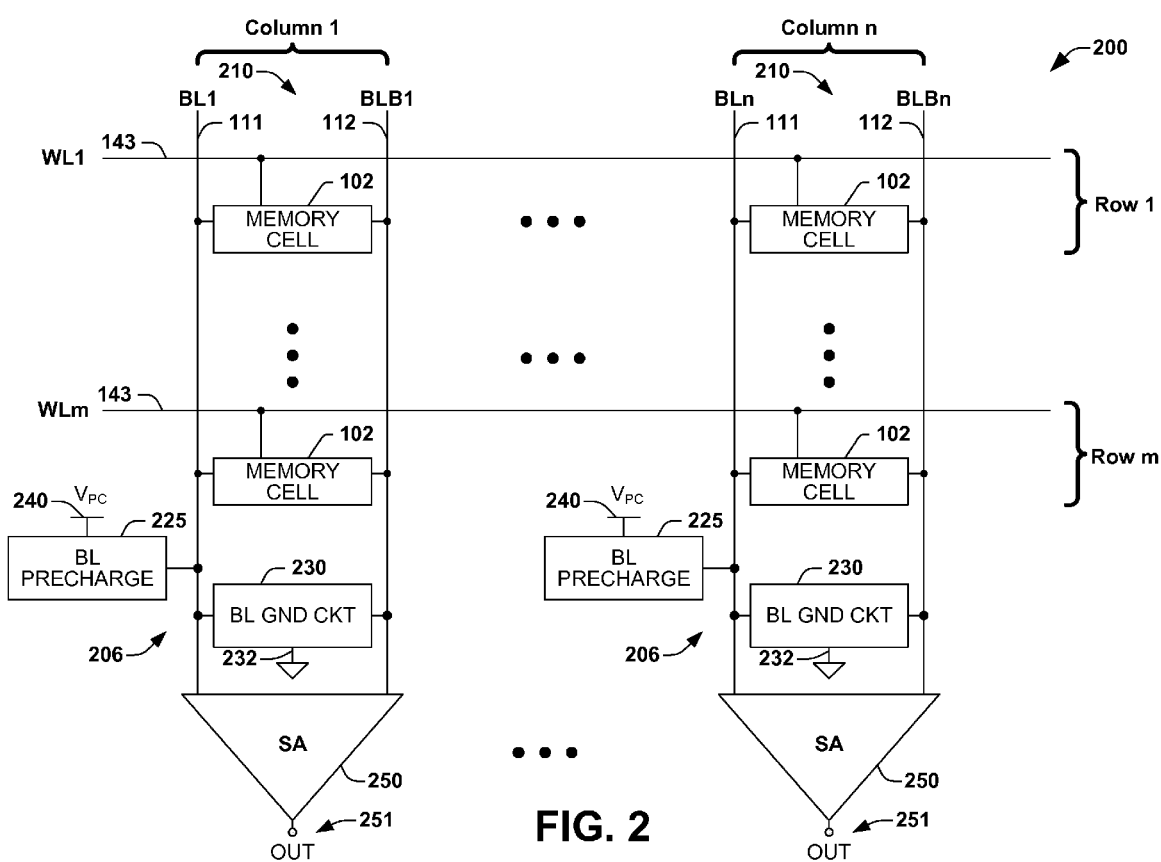
FIG. 2 is a block diagram illustrating a memory array utilizing a quasi-differential read memory configuration according to an embodiment of the invention.

FIG. 2 illustrates a block diagram of a memory array 200 utilizing a quasi-differential read circuit according to one embodiment of the invention. The memory architecture comprises a portion of a memory array containing a plurality of bit line pairs (210) (BL1 (111) and BLB1 (112) . . . BLn (111) and BLBn (112)) arranged in a plurality of columns (column1 . . . n) and a plurality of word lines (WL1 . . . WLm) 143 arranged in rows, in one embodiment. Associated with each of the bit line pairs 210 is a read circuit 206 for sensing a state of memory cell 102, for example, comprising a phase change memory element 102a and a WL select transistor 102b, as illustrated in FIG. 1B. The read circuit 206, in one embodiment, comprises a bit line precharge circuit 225, a bit line grounding circuit 230, and a sense circuit or sense amplifier circuit SA 250. Similarly, associated with each of the word lines WL1 . . . WLm 143, are a row of memory cells 102, for example, comprising a word line select circuit 133 and a memory element 102a such as a phase change memory element in one embodiment. In one embodiment, the phase change memory element includes a component containing a transition metal oxide. Although various embodiments will be described herein in conjunction with a phase change memory, it should be understood that the present invention may be incorporated into other types of memory technologies, and all such memories are contemplated as falling within the scope of the present invention.

Still referring to FIG. 2, the read circuit 206 is associated with the memory array portion and operates to read data from the various memory cells 102 and memory elements 102a associated therewith. In one embodiment the read circuit 206 is operable to read one column (bit line pair 210) at a time. In another embodiment, the read circuit 206 is operable to read one of a number of columns (n columns or pairs of bit lines), such as 4, 8, 16 or 32 columns in various embodiments. Other alternative configurations may also be employed and are contemplated as falling within the scope of the present invention. In one embodiment the read circuit 206 comprises a PMOS transistor coupled between the bit line BL and a precharge voltage potential, the transistor having a known on-state resistance to permit a predetermined or first charge rate of the bit line BL 111.

In one embodiment, the bit line grounding circuit 230 of the read circuit 206, is configured to ground the bit lines of the respective bit line pair 210 (e.g., BL 111 and BLB 112) to a ground potential 232, to discharge any residual charge on either of the bit lines of the respective bit line pair 210.

In one embodiment, the bit line precharge circuit 225, is configured to precharge a first bit line BL 111 of the respective bit line pair 210 toward a precharge voltage $V_{PC}$ 240 and to precharge a second bit line BLB 112 of the respective bit line pair 210 through the phase change memory cell coupled between the pair of bit lines 210. Thus, both the first bit line BL111 and the second bit line BLB 112 may comprise charged lines.

In one embodiment, the sense amplifier SA 250, is configured to generate an output 251 that is a function of a differential voltage between the bit line BL111 and the bit line bar BLB 112. In one embodiment, the output 251 is a differential voltage that corresponds to the difference between the charge rates of the bit line BL111 and the BLB 112, in response to a state of a memory cell, in order to read data from the memory cell.

In accordance with one embodiment of the invention, the above architecture 200 provides a high accuracy read circuitry configuration that advantageously avoids a breakdown of the resistive materials within a phase change memory element, for example, by permitting read and write operations from either direction of the memory element, in contrast to those which may be employed in conventional array architectures.

In a read operation, a memory cell 102 associated with the bit line pair 210 and a word line 143 is selected, and the bit line ground circuits 230 are configured to discharge any charge on the pair of bit lines 210 to a ground potential 232. In one embodiment, the bit line precharge circuits 225 act as a selectable resistive pull-up to charge the bit line BL 111 toward a precharge voltage $V_{pc}$ 240, while the BLB 112 bit line of the bit line pair 210 is charged thru the selected memory cell 102 addressed by the active word line WL 143. In one embodiment, in a SET state (low resistance state of a phase change element) of the memory cell, the bit line BL 111 charges at about the same rate as the BLB 112, however, BLB 112 is somewhat delayed from that of the BL 111. In another embodiment, in a RESET state (high resistance state of a phase change element) of the memory cell, the bit line BL 111 charges at a much faster rate than the BLB 112. Accordingly, the differences in these charge rates produces a time dependent differential voltage or "quasi-differential voltage" in response to the SET or RESET state of the selected memory cell, to provide a quasi-differential read circuit and read operation, as will be discussed further infra in conjunction with FIG. 4.

Figure 3:
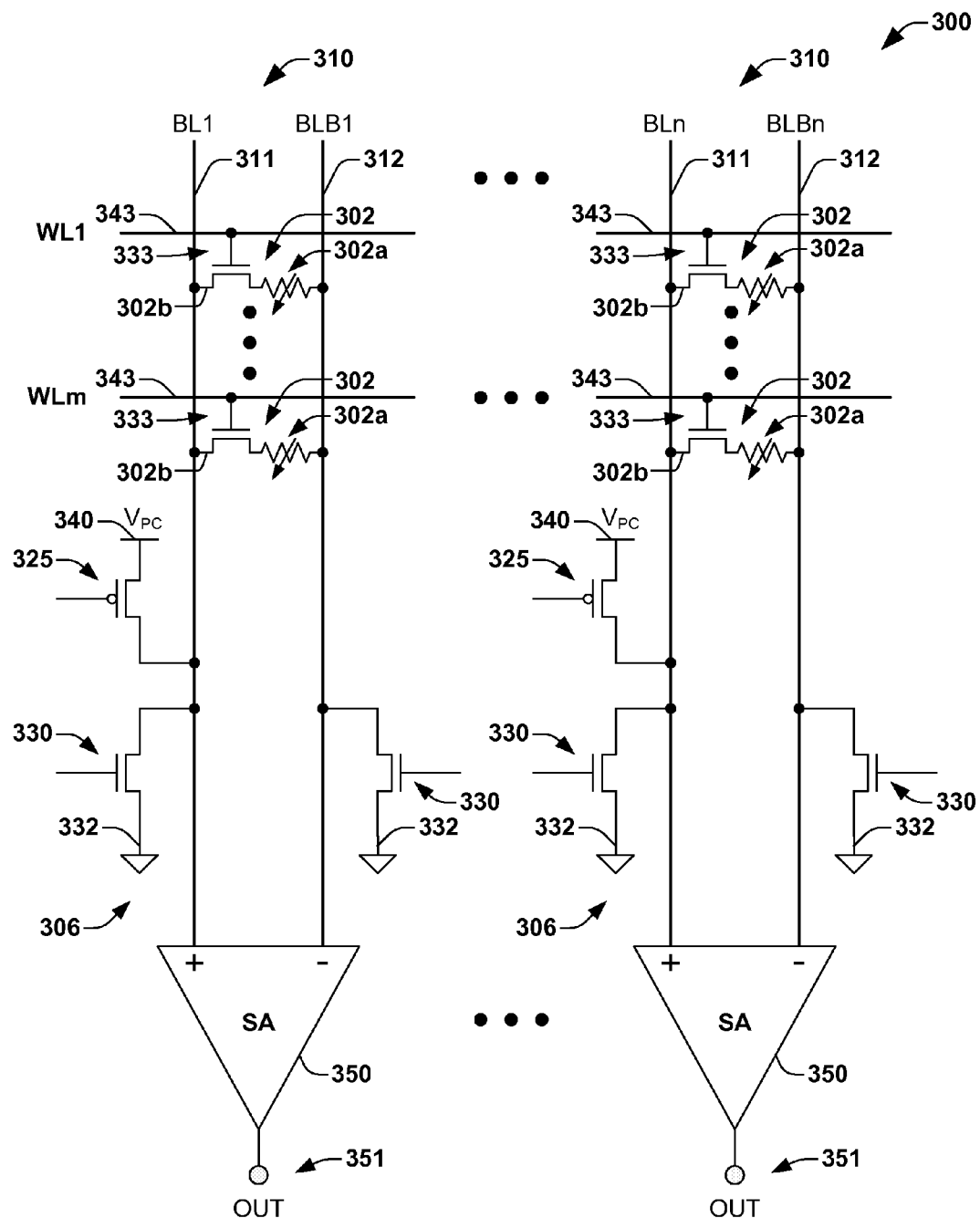
FIG. 3 is a schematic diagram illustrating a memory array utilizing a quasi-differential read circuit according to an embodiment of the invention.

FIG. 3 illustrates an exemplary memory array 300 utilizing a quasi-differential read circuit 306 according to one embodiment of the invention. The memory array 300 comprises a portion of a memory array containing a plurality of bit line pairs 310 (BL1 (311) and BLB1 (312) . . . BLn (311) and BLBn (312)) arranged in a plurality of bit line pair columns (310) and a plurality of word lines (WL1 . . . WLm) 343 arranged in rows, in one embodiment. Associated with each of the bit line pairs 310 is a read circuit 306 for sensing a state of memory cell 302, for example, comprising a phase change memory element 302a and a WL select transistor 302b. The read circuit 306, for example, comprises a bit line precharge circuit 325, a bit line grounding circuit 330, and a sense amplifier circuit SA 350. Similarly, associated with each of the word lines WL1 . . . WLm 343, are a row of memory cells 302, for example, comprising a word line select circuit 333 to select the memory element 302a such as a phase change memory element in one embodiment. In one embodiment, the phase change memory element includes a component containing a transition metal oxide. Although various embodiments will be described herein in conjunction with a phase change memory, it should be understood that the present invention may be incorporated into other types of memory technologies, and all such memories are contemplated as falling within the scope of the present invention.

Still referring to FIG. 3, the read circuit 306 is associated with the memory array portion 300 and operates to read data from the various memory cells 302 and memory elements 302a associated therewith. In one embodiment the read circuit 306 is operable to read one column (bit line pair 310) at a time. In another embodiment, the read circuit 306 is operable to read a number of columns concurrently (n columns or pairs of bit lines), such as 4, 8, 16 or 32 columns in various embodiments. Other alternative configurations may also be employed and are contemplated as falling within the scope of the present invention. In one embodiment the read circuit 306 comprises a precharge circuit 325 having a PMOS transistor coupled between the bit line BL 311 and a precharge voltage potential $V_{pc}$ 340, the precharge transistor having a known on-state resistance R that permits a predetermined or first charge rate of the bit line BL 111 capacitance C, according to TC=R*C.

In one embodiment of the invention, the time constant TC of a first charge rate at the first bit line with the memory cell in a SET state is about the same as a second charge rate at the second bit line with the memory cell in the SET state due to the relatively small resistance of the memory element 302a in the SET state, according to:

$TC_{SBL} = R_{PR}*C_{BL} = TC_{SBLB} = R_S*C_{BLB}$

In another aspect, the time constant TC of the first charge rate at the first bit line and the second charge rate at the second bit line with the memory cell in the RESET state may be determined according to:

$TC_{RBL} = R_{PR}*C_{BL}$, and $TC_{RBLB} = R_{PR}*C_{BL} + R_R*C_{BLB}$ where $TC_{SBL}$=time constant of the BL with the memory cell in a SET state, $TC_{SBLB}$=time constant of the BLB with the memory cell in a SET state, $TC_{RBL}$=time constant of the BL with the memory cell in a RESET state, $TC_{RBLB}$=time constant of the BLB with the memory cell in a RESET state, $R_{PR}$=the on-resistance of the precharge circuit,
$R_S$=a SET resistance of the memory cell,
$R_R$=a RESET resistance of the memory cell,
$C_{BL}$=a capacitance of the first bit line,
$C_{BLB}$=the capacitance of the second bit line.

In one embodiment, the bit line grounding circuit 330 of the read circuit 306, is configured to ground the bit lines of the respective bit line pair 310 (e.g., BL 311 and BLB 312) to a ground potential 332, to discharge any residual charge on either of the bit lines of the respective bit line pair 310.

In one embodiment, the bit line precharge circuit 325, is configured to precharge a first bit line BL 311 of the respective bit line pair 310 toward a precharge voltage $V_{PC}$ 340 and to precharge a second bit line BLB 312 of the respective bit line pair 310 through the resistive memory cell (e.g., phase change memory cell) coupled between the pair of bit lines 310.

In one embodiment, the sense amplifier SA 350, is configured to generate an output 351 that is a function of a differential voltage between the bit line BL311 and the BLB 312 of bit line pair 310. In one embodiment, the output 351 is a differential voltage that corresponds to the difference between a first charge rate at the bit line BL311 and a second charge rate at the bit line bar BLB 312, in response to a state of a memory cell (e.g., a SET and a RESET state), thereby enabling the reading of data from the memory cell.

In accordance with one embodiment of the invention, the above memory array architecture 300 provides a high accuracy read circuitry configuration 306 that advantageously avoids a breakdown of the resistive materials, for example, within a phase change memory element, by permitting read and write operations from either direction (e.g., from either BL or BLB) of the memory element, in contrast to those which may be employed in conventional array architectures. It will be appreciated by those skilled in the art that such bidirectional read/write operations may, for example, utilize a second bit line precharge circuit on BLB 312, similar to BL precharge circuit 325 of FIG. 3. Thus, either the bit line BL311 or the bit line bar BLB 312 may be thought of as a charged line.

In a read operation, a memory cell 302 associated with the bit line pair 310 and a word line 343 is selected, and the bit line ground circuits 330 are configured to discharge any charge on the pair of bit lines 310 to a ground potential 332. In one embodiment, the bit line precharge circuits 325 act as a selectable resistive pull-up to charge the bit line BL 311 toward a precharge voltage $V_{PC}$ 340, while the BLB 312 bit line of the bit line pair 310 is charged thru the selected memory cell 302 addressed by the active word line WL 343. In one embodiment, in a SET state (low resistance state of a phase change element) of the memory cell, the bit line BL 311 charges at about the same rate as the BLB 312, however, BLB 312 is somewhat delayed from that of the BL 311. In another embodiment, in a RESET state (high resistance state of a phase change element) of the memory cell, the bit line BL 311 charges at a much faster rate than the BLB 312. Accordingly, the differences in these charge rates produces a time dependent differential voltage or "quasi-differential voltage" in response to the SET or RESET state of the selected memory cell, to provide a quasi-differential read circuit and read operation, as will be discussed further infra.

Figure 4:
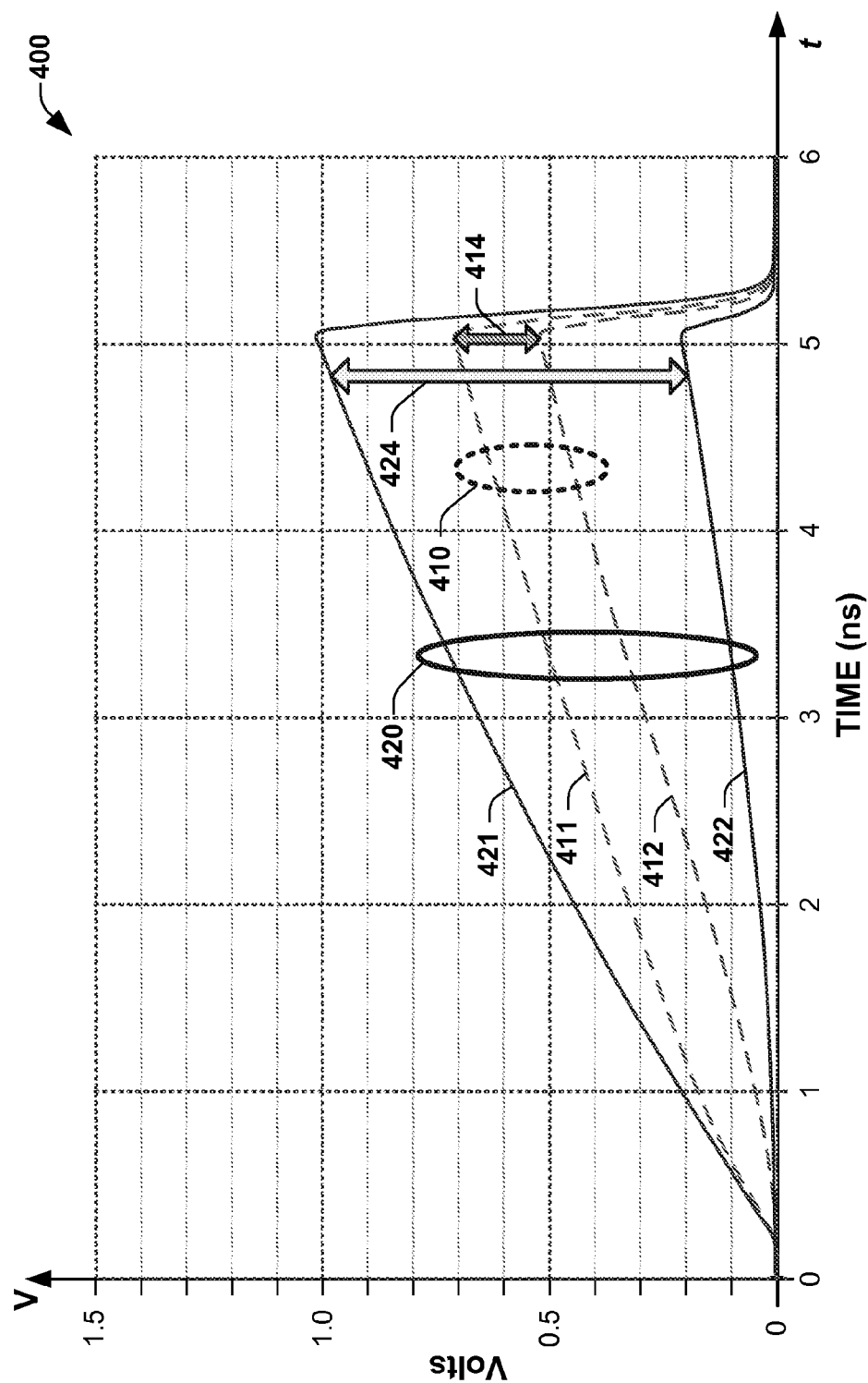
FIG. 4 is a simulation plot illustrating the operation of a quasi-differential read circuit according to another embodiment of the invention.

FIG. 4 illustrates an exemplary simulation plot 400 of the operation of a quasi-differential read circuit such as that of FIGS. 2 and 3, according to another embodiment of the invention. Simulation plot 400 illustrates exemplary charge rates of the bit line BL 311 and the bit line bar BLB 312, during resistive memory cell (e.g., phase change memory cell PCRAM) read operations of the read circuit 306, with the memory cell 302 associated with a respective bit line pair 310 is in one of a SET 410 and RESET 420 data states. The SET 410 and RESET 420 data state plots of FIG. 4 illustrate the voltage potentials on the bit lines of the bit line pair, as the bit lines charge toward a predetermined precharge voltage potential V$_{PC}$ 340 such as 1 Volt, beginning at about time=0, and differentially reading these potentials at about time=5 ns (or another predetermined time).

For example, SET state 410 of FIG. 4 illustrates the charge rate of voltage V$_{BL\_S}$ 411 on BL 311 when the memory cell 302 is in a SET state 410, for example, in a low resistance state of a PCRAM, and the charge rate of voltage V$_{BLB\_S}$ 412 on BL 312 when the memory cell 302 is in a SET state 410, for example, in a low resistance state of the PCRAM. The two bit lines of the bit line pair 310 may then be compared in the SET state 410, for example, by differentially reading the voltage difference ΔV$_S$ 414 (e.g., about 200 mV) at time =5 ns.

RESET state 420 of FIG. 4 illustrates the charge rate of voltage V$_{BL\_R}$ 421 on BL 311 when the memory cell 302 is in a RESET state 420, for example, in a high resistance state of a PCRAM, and the charge rate of voltage V$_{BLB\_R}$ 422 on BL 312 when the memory cell 302 is in a RESET state 420, for example, in a high resistance state of the PCRAM. The two bit lines of the bit line pair 310 may then be compared in the RESET state 420, for example, by differentially reading the voltage difference ΔV$_R$ 424 (e.g., about 800 mV) at time=5 ns.

In one embodiment, the bit line 311 and bit line bar 312 are coupled to a sense amplifier 350 configured to provide a voltage output 351 which is a function of the differential voltage between the bit line pair, for example, differential voltage ΔV$_S$ 414 and ΔV$_R$ 424 may be compared, for example, at time=5 ns to obtain output voltage 351. Accordingly, voltage difference ΔV$_S$ 414, may then be used by sense amp SA350 with appropriate feedback, to latch output 351 in response to a SET state, and used by voltage difference ΔV$_R$ 424 to latch output 351 in response to a RESET state of the memory cell 302.

In one embodiment, the sensing circuit comprises a sense amplifier 350 having an input offset, for example, with suitable feedback for reading the differential voltage between first BL 311 and second BLB 312 bit lines as first and second positive voltage values corresponding to or in response to the state of the selected memory cell 302 associated with the respective bit line pair 310.

From the voltage plots of FIG. 4, it may be observed that there is a substantial difference in the magnitudes of differential voltages ΔV$_S$ 414 and ΔV$_R$ 424, wherein a small SET differential voltage ΔV$_S$ 414 corresponds to the SET state of memory cell 302, and a large RESET differential voltage ΔV$_R$ 424 corresponds to the RESET state of memory cell 302.

In addition, from the voltage plots of FIG. 4, it may be observed that there is a substantial difference in the magnitudes of the charge rates of the bit lines in the RESET state 420, and almost no difference in the magnitudes of the charge rates, or nearly the same charge rates of the bit lines in the SET state 410. That is, V$_{BL\_S}$ 411 on BL 311 charges at about the same rate as V$_{BLB\_S}$ 412 on BL 312 when the memory cell 302 is in a SET state 410. Thus, in one embodiment of the invention, the time constant TC of a first charge rate at the first bit line with the memory cell in a SET state is about the same as a second charge rate at the second bit line with the memory cell in the SET state, according to:

$$TC=R_{PR}*C_{BL}=R_S*C_{BLB}$$

Accordingly, the on-state resistance R$_{PR}$ of the precharge circuit (or transistor) 325, may be adjusted to be equal to R$_S$, the SET resistance of the memory cell, assuming the bit line capacitances C$_{BL}$ and C$_{BL}$, are approximately equal. The inventor of the present invention has appreciated that the variable assignment relationships described above may provide advantageous impedance matching between the precharge circuit and the memory cell and bit lines, thereby permitting a relatively large output difference between the SET and RESET states.

In one embodiment, during a read, only one memory element 302a associated with the bit line pair 310 is read (or sensed) at a time, based upon control of the respective word lines WL 343. In one embodiment the word line associated with the memory element to be sensed is activated (e.g., pulled high) while the remaining word lines are in-activated (e.g., pulled low). In this embodiment the associated word line select circuit 333 electrically couples the respective memory element 302a to the respective bit line pair 310. After discharging BL 311 and BLB 312, for example, with the bit line ground circuit 330, and based on the data state of the memory element 302a, the bit line BL 311 is charged at a unique time constant TC based on the charge rate or RC during the precharge toward the precharge voltage potential V$_{PC}$ 340. Meanwhile, the BLB 312 is charged at another unique time constant TC based on the charge rate or RC, and the differential voltage is sensed and/or amplified by sense amplifier 350 of read circuit 306 for sensing thereof and output at output 351.

In another embodiment and by choice of the heating current, intermediate resistance states are realized which enables multiple levels stored with one physical memory cell (multi-level memory cells). For example, 3 levels correspond to 1.5 bit/cell, 4 levels correspond to 2 bit/cell, and so on.

It will also be appreciated by those skilled in the art that additional states of a multi-level resistive memory cell (e.g., a four-level/state memory cell) may be similarly read, by identifying other unique intermediate charge rates or charge rate differentials between bit line pairs, and/or by sensing additional magnitudes of differential voltages between the pair of bit lines corresponding to additional respective states of the multi-level memory cell. For example, between the discussed SET state (e.g., S1) corresponding to a ΔV$_1$ of about 200 mV and a RESET state (e.g., S4) corresponding to a ΔV$_4$ of about 800 mV, two additional memory cell states and two corresponding intermediate differential voltages, such as S2 corresponding to a ΔV$_2$ of about 400 mV, and S3 corresponding to a ΔV$_3$ of about 600 mV may also be identified, using the read sensing operation discussed above. This example then provides a total of four exemplary states at four corresponding differential voltages (e.g., S1=ΔV$_1$@200 mV, S2=ΔV$_2$@400 mV, S3=ΔV$_3$@600 mV, S4=ΔV$_3$@800 mV).

In one embodiment, precharge voltage V$_{PC}$ 340 has a value less than or equal to the supply voltage V$_{DD}$, to prevent a breakdown of the resistive material.

In one embodiment of the invention 300 of FIG. 3, a method of reading a phase change memory array 300 is disclosed. In one embodiment, the method comprises providing read circuitry 306 associated with a pair of bit lines 310, and thereafter using the read circuitry 306 to read differentially one of a SET and a RESET state of a phase change memory cell 302 associated with the pair of bit lines 310.

In another embodiment, the method of using the read circuitry comprises selectively coupling a first bit line 311 of the pair of bit lines 310 to a phase change element 302a of the memory cell 302. Then, the pair of bit lines 310 is grounded to a ground potential 332, for example, using the bit line grounding circuit 330. The first bit line 311 is charged at a first rate using the precharge circuit 325, precharging to a precharge voltage potential 340, and a second bit line 312 of the respective bit line pair 310 is charged at a second rate. The first and second charge rates are based on one of the SET 410 and RESET 420 states of a memory cell 302 associated with the respective bit line pair 310 of the memory array 300.

Finally, a sense amp 350 having an input offset and suitable feedback, for example, may be used for sensing a differential voltage between first 311 and second 312 bit lines of the bit line pair 310 as a result of the respective first and second charge rates in response to the state of the memory cell associated with the bit line pair 310 in the array portion 300.

In one embodiment, the method further comprises determining one of the SET and RESET states of the phase change element 302a from the sensed differential voltage 351.

In one embodiment the precharge device is connected to the word line of a cross-point array and charged at a constant rate. The bit line of the selected column follows the charge rate of the word line depending on the programmed resistance of the memory element with more or less delay. The constant charge rate of the word line is provided to the sense amplifier as a reference signal to be able to distinguish between fast and slow charging of the selected bit line.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A resistive memory device, comprising:
an array portion of resistive memory cells, wherein a resistive memory cell is coupled between a pair of bit lines; and
a read circuit operably associated with the bit line pair in the array portion configured to read a data state of the resistive memory cell associated with the respective bit line pair,
wherein the read circuit comprises a precharge circuit configured to charge a first bit line of the respective bit line pair at a first rate, and charge a second bit line of the respective bit line pair at a second rate, wherein the first and second charge rates are based on a state of a memory cell coupled between the respective bit line pair,
wherein a time constant TC of the first charge rate of the first bit line with the resistive memory cell in a SET state is about the same as the second charge rate of the second bit line with the resistive memory cell in the SET state.

2. The memory of claim 1, wherein the resistive memory is a phase change memory element.

3. The memory of claim 1, wherein the read circuit comprises a sense circuit portion coupled to the bit line pair configured to sense a differential voltage between first and second bit lines of the bit line pair in response to a state of a selected memory cell associated with the bit line pair in the array portion.

4. The memory of claim 3, wherein the sense circuit comprises a sense amplifier having an input offset and a feedback circuit for reading the differential voltage between first and second bit lines as first and second positive voltage values in response to the state of the selected memory cell associated with the respective bit line pair.

5. The memory of claim 1, wherein the read circuit is coupled between the bit line and the word line charging circuit of a cross-point memory array portion.

6. The memory of claim 1, wherein the read circuit comprises:
a bit line ground circuit portion coupled to the bit line pair, configured to pull the respective bit line pair to a ground potential;
a precharge circuit portion configured to precharge a first bit line of the respective bit line pair to a precharge voltage; and
a sense circuit portion coupled to the bit line pair configured to sense a differential voltage between first and second bit lines of the bit line pair in response to a state of the memory cell associated with the bit line pair in the array portion.

7. The memory of claim 1, wherein the read circuit comprises a bit line ground circuit portion coupled to the bit line pair, configured to pull the respective bit line pair to a ground potential prior to precharging the first and second bit lines.

8. The memory of claim 1, wherein the precharge circuit portion is further configured to precharge the first bit line of the respective bit line pair at the first rate and the second bit line of the respective bit line pair at the second rate based on one or more of the precharge voltage, an on-resistance of the precharge circuit, a capacitance of the first bit line, a capacitance of the second bit line, and a resistance of the memory cell.

9. The memory of claim 8, wherein the time constant TC of the first charge rate at the first bit line with the memory cell in the SET state and the second charge rate at the second bit line with the memory cell in the SET state is determined according to:

$$TC = RPR*CBL = TCSBLB = RS*CBLB,\text{ and}$$

the time constant TC of the first charge rate at the first bit line and the second charge rate at the second bit line with the memory cell in the RESET state is determined according to:

$$TCRBL = RPR*CBL,\text{ and}$$

$$TCRBLB = RPR*CBL + RR*CBLB$$

where
TCSBL=time constant of the BL with the memory cell in a SET state,
TCSBLB=time constant of the BLB with the memory cell in a SET state,
TCRBL=time constant of the BL with the memory cell in a RESET state,
TCRBLB=time constant of the BLB with the memory cell in a RESET state,
RPR=the on-resistance of the precharge circuit,
RS=a SET resistance of the memory cell,
RR=a RESET resistance of the memory cell,
CBL=a capacitance of the first bit line,
CBLB=the capacitance of the second bit line.

10. The memory of claim 8, wherein the reading of the data state is executed in two or more consecutive steps using different charge rates on the charged line to read multiple levels from the memory cell.

11. A resistive memory, comprising:
an array portion of resistive memory cells comprising a plurality of bit line pairs; and
a read circuit operably associated with one of the bit line pairs, wherein the read circuit comprises a precharge circuit configured to charge a first bit line of the respective bit line pair at a first rate, and to charge a second bit line of the respective bit line pair at a second rate, the first and second charge rates based on a state of a memory cell coupled between the respective bit line pair, and wherein a time constant TC of the first charge rate at the first bit line with the memory cell in a SET state is about the same as a time constant TC of the second charge rate at the second bit line with the memory cell in the SET state.

12. The resistive memory of claim 11, wherein the charging rates are further based on a precharge voltage, and wherein the time constant TC of the first charge rate at the first bit line with the memory cell in a SET state and the second charge rate at the second bit line with the memory cell in the SET state is determined according to:

$$TC=RPR*CBL=RS*CBLB$$

where
RPR=an on-resistance of the precharge circuit,
CBL=a capacitance of the first bit line,
RS=a SET resistance of the memory cell,
CBLB=a capacitance of the second bit line.

13. The resistive memory of claim 11, wherein the read circuit further comprises a bit line ground circuit portion configured to pull a respective pair of bit lines to a ground potential.

14. The resistive memory of claim 11, wherein the read circuit further comprises:
a bit line ground circuit portion coupled to the bit line pair, configured to pull the respective bit line pair to a ground potential; and
a sense circuit portion coupled to the bit line pair configured to sense a differential voltage between first and second bit lines of the bit line pair in response to the state of the memory cell associated with the bit line pair in the array portion.

15. The resistive memory of claim 11, wherein the resistive memory cells comprise phase change memory cells.

16. The resistive memory of claim 11, wherein the resistive memory cells comprise a component containing a transition metal oxide.

17. A memory device, comprising:
an array portion of resistive memory cells, wherein a resistive memory cell is coupled between a pair of bit lines; and
means for reading differentially one or more resistive memory cells along the pair of bit lines,
wherein the reading means comprises a precharge circuit configured to charge a first bit line of the respective bit line pair to a precharge voltage, and to charge a second bit line of the respective bit line pair through the resistive memory cell coupled to the first bit line, and
wherein a time constant TC of the first charge rate at the first bit line with the memory cell in a SET state is about the same as a time constant TC of the second charge rate at the second bit line with the memory cell in the SET state.

18. The memory device of claim 17, further comprising sensing means operably associated with the pair of bit lines for outputting a value associated with a data state of the memory cell associated with the bit line pair.

19. The memory device of claim 17, wherein the reading means is associated with one or more pairs of bit lines.

20. The memory device of claim 17 wherein the reading means comprises a bit line ground circuit portion coupled to the bit line pair, configured to pull the respective bit line pair to a ground potential.

21. The memory device of claim 17, wherein the resistive memory cells comprise phase change memory cells.

22. A method of reading a phase change memory, comprising:
providing read circuitry associated with a pair of bit lines; and
using the read circuitry to read differentially one of a SET and a RESET state of a phase change memory cell associated with the pair of bit lines, wherein using the read circuitry comprises:
selectively coupling a phase change element of the memory cell between the pair of bit lines;
charging a first bit line of the respective bit line pair at a first rate; and
charging a second bit line of the respective bit line pair at a second rate, the first and second charge rates based on the state of a memory cell associated with the respective bit line pair and a respective word line, wherein the first and second rates are about the same with the resistive memory cell in the SET state.

23. The method of claim 22, wherein using the read circuitry comprises:
selectively coupling a first bit line of the pair of bit lines to a phase change element of the memory cell;
grounding the pair of bit lines to a ground potential;
charging the first bit line at a first rate using a precharge voltage potential; and
charging a second bit line of the respective bit line pair at a second rate, the first and second charge rates based on one of the set and reset states of a memory cell associated with the respective bit line pair of the memory; and
sensing a differential voltage between first and second bit lines of the bit line pair as a result of the respective first and second charge rates in response to the state of the memory cell associated with the bit line pair in the array portion.

24. The method of claim 23, further comprising determining one of the SET and RESET states of the phase change element from the sensed differential voltage.

* * * * *